(12) United States Patent
Nath et al.

(10) Patent No.: US 11,658,480 B2
(45) Date of Patent: May 23, 2023

(54) ULTRA-LOW LEAKAGE ELECTROSTATIC DISCHARGE DEVICE WITH CONTROLLABLE TRIGGER VOLTAGE

(71) Applicant: GLOBALFOUNDRIES U.S. Inc., Santa Clara, CA (US)

(72) Inventors: Anindya Nath, Essex Junction, VT (US); Zhiqing Li, Halfmoon, NY (US); Souvick Mitra, Essex Junction, VT (US); Alain Loiseau, Williston, VT (US); Wei Liang, South Burlington, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/068,967

(22) Filed: Oct. 13, 2020

(65) Prior Publication Data
US 2022/0115864 A1 Apr. 14, 2022

(51) Int. Cl.
*H02H 9/04* (2006.01)
*H01L 27/02* (2006.01)

(52) U.S. Cl.
CPC ......... *H02H 9/046* (2013.01); *H01L 27/0248* (2013.01); *H01L 27/0262* (2013.01); *H01L 27/0266* (2013.01)

(58) Field of Classification Search
CPC ...... H02H 9/046; H02H 27/0248–0296; H01L 27/0262; H01L 27/0266
See application file for complete search history.

(56) References Cited

U.S. PATENT DOCUMENTS

| | | | |
|---|---|---|---|
| 5,086,365 A * | 2/1992 | Lien | H01L 27/0266 257/356 |
| 5,246,872 A * | 9/1993 | Mortensen | H01L 27/0255 438/200 |
| 5,563,757 A | 10/1996 | Corsi | |
| 5,856,214 A | 1/1999 | Yu | |
| 6,414,831 B1 | 7/2002 | Orchard-Webb | |
| 6,768,616 B2 | 7/2004 | Mergens et al. | |
| 2005/0212052 A1* | 9/2005 | Yach | H01L 27/0259 257/360 |
| 2014/0027526 A1 | 1/2014 | Shadbolt et al. | |
| 2014/0264556 A1* | 9/2014 | Lai | H01L 29/66659 257/328 |

OTHER PUBLICATIONS

Nikolaidis, T. et al.; "A Novel SCR ESD Protection for Triple Well CMOS Technologies"; IEEE Electron Device Letters; vol. 22; No. 4; Apr. 2001; Copyright 2001 IEEE; pp. 185-187.

(Continued)

*Primary Examiner* — Jared Fureman
*Assistant Examiner* — Christopher J Clark
(74) *Attorney, Agent, or Firm* — Anthony Canale; Hoffman Warnick LLC

(57) ABSTRACT

Embodiments of the disclosure provide an electrostatic discharge (ESD) device, including: an input pad; an underlapped field effect transistor (UL-FET) with a trigger voltage Vt, including: an underlapped drain region coupled to the input pad; a source region coupled to ground; and a gate structure coupled to the input pad; and a blocking layer separating the underlapped drain region from the gate structure of the UL-FET by an underlap distance.

16 Claims, 6 Drawing Sheets

(56) References Cited

OTHER PUBLICATIONS

Yang, Zhaonian et al.; "Impact of the Gate Structure on ESD Characteristic of Tunnel Field-Effect Transistors"; The 7th IEEE International Symposium on Next-Generation Electronics; ISNE 2018; Copyright 2018 IEEE; pp. 4.

Lee, Kwang-Won et al.; "An underlap field-effect transistor for electrical detection of influenza"; Applied Physics Letters 96; Published Online Jan. 21, 2010; Copyright 2010 American Institute of Physics; pp. 4.

Russ, Christian C. et al.; "GGSCRs: GGNMOS Triggered Silicon Controlled Rectifiers for ESD Protection in Deep Sub-Micron CMOS Processes"; SOFICS Solutions for ICs; EOS/EDS symposium 2001; Copyright 2011 Sofics Proprietary; pp. 12.

Solaro, Yohann et al.; "Z2-FET: A promising FDSOI device for ESD protection"; Solid-State Electronics 97 (2014); May 17, 2014; 23-29; ScienceDirect; Copyright 2014 Elsevier Ltd.; pp. 7; <http://dx.doi.org/10.1016/j.sse.2014.04.032>.

Krishnaraja, Abinaya et al.; "Reducing ambipolar off-state leakage currents in III-V vertical nanowire tunnel FETs using gate-drain underlap"; Applied Physics Letters 115; Published Oct. 1, 2019; Copyright 2019 Author(s); pp. 5; <https://doi.org/10.1063/1.5115296>.

Jawa, Himani et al.; "Electrically Tunable Room Temperature Hysteresis Crossover in Underlap Mos2 FETs"; pp. 22.

* cited by examiner

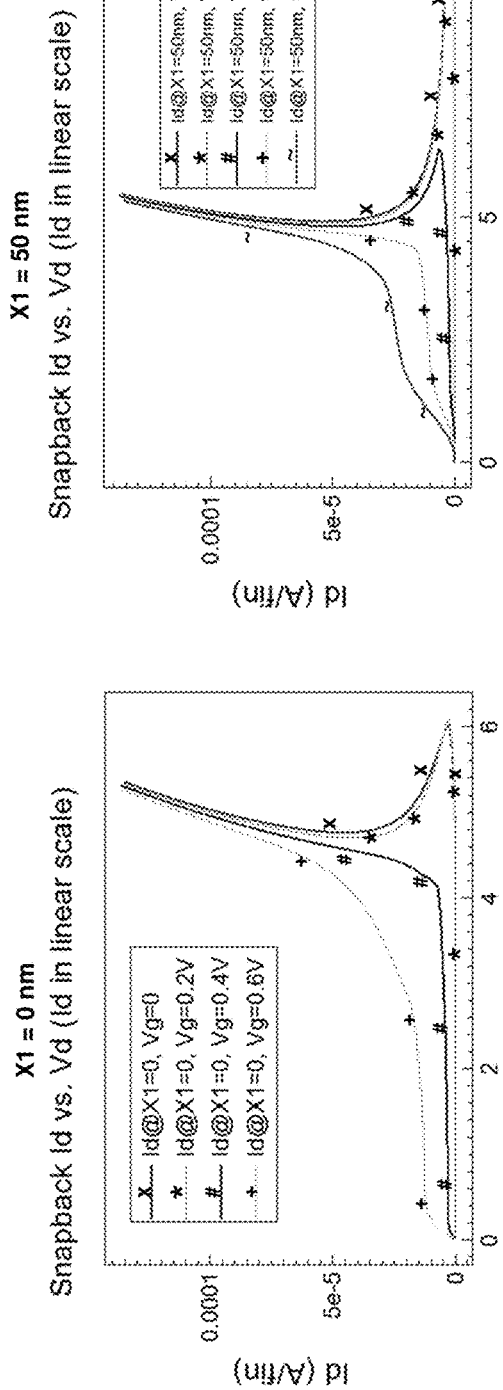
FIG. 6
FIG. 7
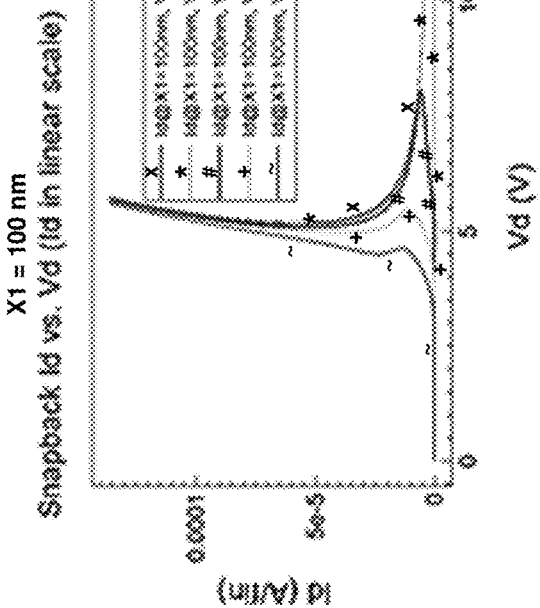
FIG. 8

Table 1

| Underlap (nm) | Vg (V) | Vt (V) |
|---|---|---|
| 0 | 0 | 6.0 |
| | 0.2 | 6.0 |
| | 0.4 | 4.2 |
| 50 | 0 | 10.5 |
| | 0.2 | 10.5 |
| | 0.4 | 6.5 |
| | 0.6 | 4.5 |
| | 0.8 | 3.5 |
| 100 | 0 | 11 |
| | 0.2 | 11 |
| | 0.4 | 8.0 |
| | 0.6 | 5.5 |
| | 0.8 | 4.5 |

FIG. 9

ULTRA-LOW LEAKAGE ELECTROSTATIC DISCHARGE DEVICE WITH CONTROLLABLE TRIGGER VOLTAGE

BACKGROUND

The present disclosure relates to integrated circuits, and more specifically, to an electrostatic discharge (ESD) device with ultra-low current leakage and a controllable trigger voltage.

An integrated circuit (IC) may be exposed to random ESD events that can direct potentially large and damaging ESD currents to sensitive electronic components of the IC. An ESD event may occur, for example, during post-manufacture chip handling or after chip installation on a circuit board or other carrier. During an ESD event, an electrostatic charge is rapidly transferred between two objects at different electric potentials when the objects come into direct contact with each other.

To protect against ESD events, an IC may be provided with one or more ESD devices. Such ESD devices are generally designed to remain quiescent during normal operation of the IC and to turn on in response to an ESD event. When provided on an IC, designers must take into consideration the operating voltage, leakage current, breakdown constraints, and area footprint of the ESD devices.

A typical ESD device may have a trigger voltage (Vt) that is higher than the operating voltage of the IC, with the ESD device remaining in a quiescent state until an applied voltage due to an ESD event reaches or exceeds Vt. When an ESD event occurs, the ESD device enters a low-impedance state that conducts ESD current to ground and away from the sensitive electronic components of the IC. The ESD device may remain (e.g., clamped) in its low-impedance state until the ESD current is drained and the ESD voltage is discharged to an acceptable level.

Designers are often tasked with reducing the power consumption of ICs (e.g., by reducing leakage currents of ESD devices and other components). The current leakage of ESD devices is an important factor for the energy consumption of a circuit application. This is especially true for mobile electronic devices such as smart phones, tablets, wearables, or medical devices as the off-state current leakage may influence battery life and therefore operation time. Although ultra-low-leakage (ULL) ESD devices have been developed, such ULL ESD devices generally require a trigger voltage that is much higher than the operating voltages of other circuits/devices on the IC. Although the trigger voltage may be adjusted (e.g., using additional implants), this generally leads to higher costs and higher leakage currents.

Examples of ESD devices with reduced leakage currents include gated silicon controlled rectifiers (SCRs), diode strings, and SCRs with a feedback loop. However, such ESD devices may have a large area footprint and increased cost. Further, such ESD devices are incapable of providing low leakage currents together with a controllable trigger voltage.

SUMMARY

A first aspect of the disclosure is directed to an electrostatic discharge (ESD) device, including: an input pad; an underlapped field effect transistor (UL-FET) with a trigger voltage Vt, including: an underlapped drain region coupled to the input pad; a source region coupled to ground; and a gate structure coupled to the input pad; and a blocking layer separating the underlapped drain region from the gate structure of the UL-FET by an underlap distance.

A second aspect of the disclosure is directed to a method for electrostatic discharge (ESD) protection, including: coupling an ESD device to a circuit to be protected, the ESD device including an underlapped field effect transistor (UL-FET) with an underlapped drain region; and controlling a trigger voltage of the UL-FET by at least one of: adjusting a gate voltage Vg applied to a gate structure of the UL-FET; adjusting a capacitance of a capacitor C coupled between the gate structure of the UL-FET and an input pad; and adjusting an underlap distance between the underlapped drain region of the UL-FET and the gate structure of the FET.

A third aspect of the disclosure is directed to a electrostatic discharge (ESD) device, including: an input pad; an underlapped n-type field effect transistor (UL-NFET) with a trigger voltage Vt, including: an underlapped n+-doped drain region formed in a p-well and coupled to the input pad; an n+-doped source region formed in the p-well and coupled to ground; and a gate structure coupled to the input pad; and a silicide blocking layer separating the n+-doped underlapped drain region from the gate structure of the UL-NFET by an underlap distance.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements.

FIG. 6 illustrates the snapback current Id (linear scale) versus drain voltage Vd of the ESD device of FIG. 1 according to embodiments for different gate voltages Vg and an underlap distance X1=0.

FIG. 7 illustrates the snapback current Id (linear scale) versus drain voltage Vd of the ESD device of FIG. 1 according to embodiments for different gate voltages Vg and an underlap distance X1=50 nm.

FIG. 8 illustrates the snapback current Id (linear scale) versus drain voltage Vd of the ESD device of FIG. 1 according to embodiments for different gate voltages Vg and an underlap distance X1=100 nm.

FIG. 9 depicts a table showing the trigger voltage Vt of the ESD device of FIG. 1 according to embodiments for different gate voltages Vg and underlap distances X1.

Figure 2:
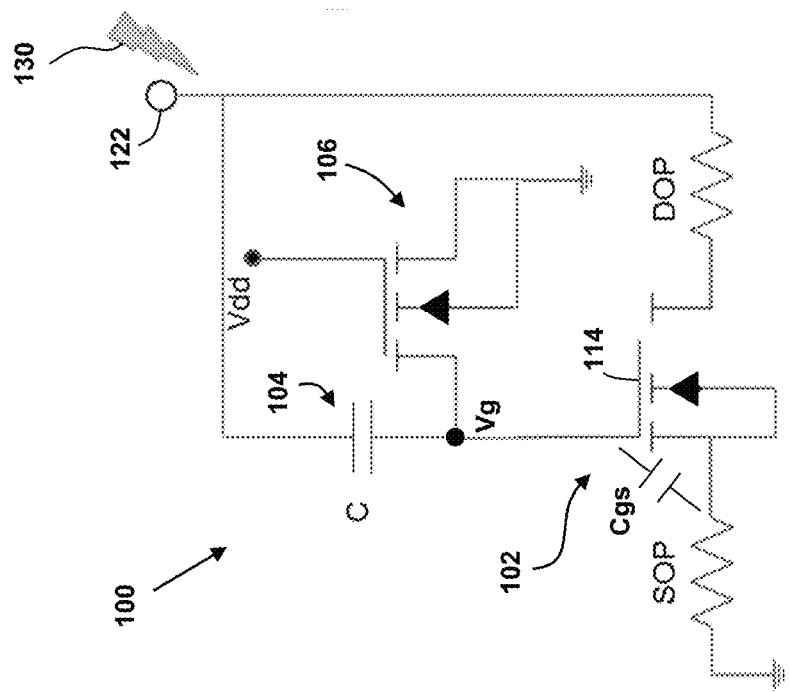
FIG. 2 depicts an equivalent electrical circuit for the ULL ESD device of FIG. 1 according to embodiments.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

An electrostatic discharge (ESD) device with ultra-low-leakage (ULL) current and a controllable trigger voltage according to embodiments is described herein. The ULL ESD device according to embodiments may include an underlapped field effect transistor (UL-FET). The gate voltage of the ULL ESD device may be dynamically controlled by the voltage applied to the gate of the UL-FET. The ULL ESD device may be tuned by adjusting a capacitance coupled to the gate of the UL-FET or varying the degree of underlap of the UL-FET. The ULL ESD device is compatible with existing masks and processes and may be provided without a significant cost increase or area penalty.

Figure 1:
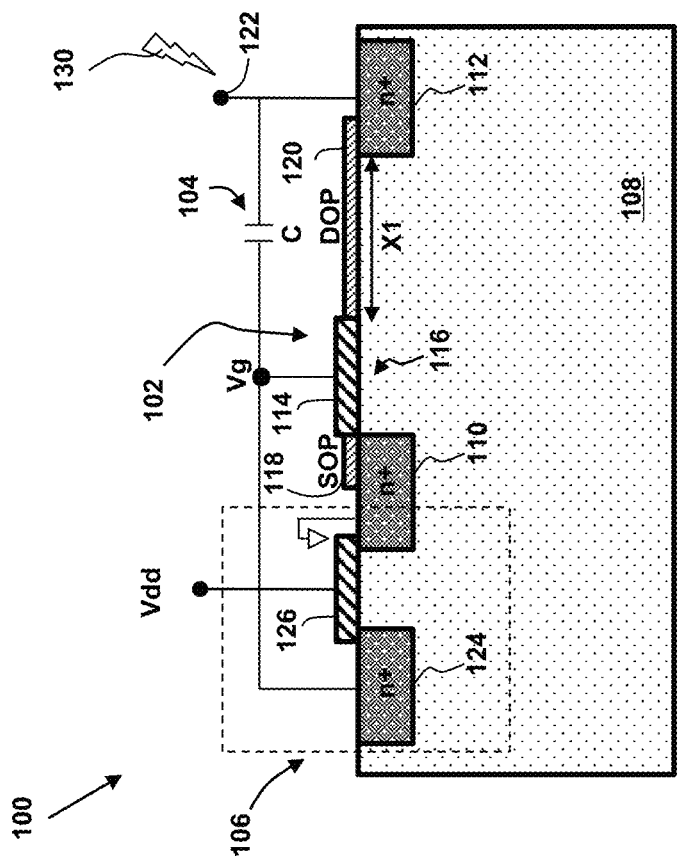
FIG. 1 depicts an ultra-low-leakage (ULL) electrostatic discharge (ESD) device with controllable trigger voltage according to embodiments.

FIG. 1 depicts an ultra-low-leakage (ULL) electrostatic discharge (ESD) device 100 (hereafter ESD device 100) with controllable trigger voltage according to embodiments. FIG. 2 depicts an equivalent electrical circuit for the ESD device 100 of FIG. 1 according to embodiments. As shown in FIGS. 1 and 2, the ESD device 100 may include an underlapped n-type field effect transistor (UL-NFET) 102, a capacitor 104 (e.g., a back end of the line (BEOL) capacitor), and an n-type switching FET (NFET) 106.

The UL-NFET 102 may be formed in a p-type doped region 108 (e.g., hereafter p-well 108) and may include an n+-doped source region 110, an underlapped n+-doped drain region 112, and a gate structure 114. By 'underlapped region' it is meant a diffusion region in which no part thereof is located directly beneath the gate structure 114. As shown in FIG. 1, for example, the underlapped n+-doped drain region 112 is spaced away from the edge of the gate structure 114 and an underlying gate channel region 116 by an underlap distance X1. The various doped regions described herein may be formed in any known manner (e.g., via ion implantation of dopants). The various gate structures described herein may also be formed in any known manner.

A silicide blocking layer, including a source-side silicide blocking (SOP) region 118 and a drain-side silicide blocking (DOP) region 120, may be formed over portions of the p-well 108, n+-doped source region 110, and underlapped n+-doped drain region 112 as shown in FIG. 1. The forming of the silicide blocking layer may include, for example, depositing an insulating layer and selectively etching the insulating layer. The silicide blocking layer may, for example, be formed of silicon oxide or silicon nitride.

According to embodiments, the underlapped n+-doped drain region 112 may be coupled to an input terminal or pad 122 (hereafter input pad 122). The gate structure 114 of the UL-NFET 102 may also be coupled to the input pad 122 through the capacitor 104. The gate structure 114 of the UL-NFET 102 may further be latched to ground through the switching NFET 106. In the equivalent circuit depicted of the ESD device 100 depicted in FIG. 2, the intrinsic gate-source capacitance of the UL-NFET 102 is represented by the capacitor Cgs. To this extent, the gate voltage Vg applied to the gate structure 114 of the UL-NFET 102 may be set by the voltage divider formed by the series connection of the capacitor 104 and the capacitor Cgs. According to other embodiments, the capacitor 104 may be replaced by the intrinsic gate-drain capacitance Cgd of the UL-NFET 102. According to further embodiments, an additional capacitor may be coupled in parallel to the intrinsic gate-source capacitance Cgs of the UL-NFET 102 to better control the gate voltage Vg.

The switching NFET 106 may also be formed in the p-well 108. The switching NFET 106 may include an n+-doped drain region 124, the n+-doped source region 110, and a gate structure 126. According to embodiments, the n+-doped drain region 110 may be shared by the switching NFET 106 and the UL-NFET 102. The gate structure 124 of the switching NFET 106 may be coupled to a supply voltage Vdd.

The switching NFET 106 may be used to control the operation of the UL-NFET 102. When Vdd is high, the gate voltage Vg at the gate structure 114 of the UL-NFET 102 is latched to ground, deactivating the UL-NFET 102. When Vdd is low, the switching NFET 106 is in floating state and the gate voltage Vg is dependent upon the voltage at the input pad 122 and the capacitance values of the capacitor 104 and the intrinsic gate-source capacitance Cgs of the UL-NFET 102.

Referring again to FIGS. 1 and 2, during an ESD event 130 (represented by the lightning bolt at the input pad 122), a gate voltage Vg is applied to the gate structure 114 of the UL-NFET 102 of the ESD device 100. As detailed above, the gate voltage Vg is dependent upon the voltage at the input pad 122 and the capacitance values of the capacitor 104 and the intrinsic gate-source capacitance Cgs of the UL-NFET 102. The ESD device 100 is activated when the voltage between the underlapped n+-doped drain region 112 and the n+-doped drain region 110 is larger than the trigger voltage Vt of the UL-NFET 102. The trigger voltage Vt is modulated by the gate voltage Vg Many ESD devices are voltage clamping devices with high resistance up to a trigger (e.g., breakdown) voltage above which their resistance drops dramatically. They turn on at that point and begin to conduct current. For such ESD devices, their trigger voltage (turn on) is above the normal operating voltage of the protected circuit, but low enough that the clamping voltage is below a voltage that can damage the protected circuit. Voltage clamping devices are ideally switched off during normal operations (allowing a negligible current through) but begin conducting current once their threshold voltage has been reached.

Looking at the internal structure of a solid state ESD device, a free electron (hole) becomes mobile in the presence of an electric field and if the electric field is low, the electron moves about without incident. On the other hand, a strong electric field produced by a high voltage associated with an ESD event energizes a mobile electron to strike and free bound electrons. The free electrons propagate the same action which leads to an avalanche of electrons (breakdown).

Snapback ESD devices, such as the ESD device 100 according to embodiments, behave differently. A typical MOSFET has a parasitic bipolar junction transistor which has a source as its emitter and drain as its collector. As the avalanche current flows to the base of the parasitic bipolar junction transistor, the base current can trigger the ESD device to allow current flows between the collector and emitter. Once triggered, the strong electric field that caused the avalanche current is no longer necessary to sustain it. Conduction of large currents continues even at lower voltages.

At low voltages, a snapback ESD device also has high resistance until it turns on at a trigger voltage Vt greater than normal operating conditions of the protected circuit. After the snapback ESD device begins to conduct (now with a low resistance), the voltage drops below the trigger voltage Vt toward the normal operating voltage of the protected circuit. That is, the device could remain in the on state, conducting current even after the ESD event is over.

An ESD protection device should be selected such that the voltage at which it triggers is not too high that it can damage sensitive components of the circuit to be protected. Similarly, the lower holding voltage should not be lower than the normal operating voltage of the circuit so that the device switches off after the ESD event ends.

Figure 3:
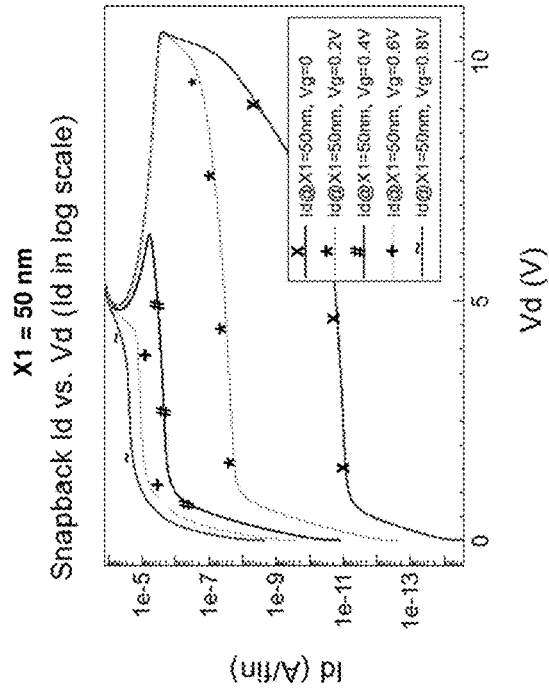
FIG. 3 illustrates the snapback current Id (log scale) versus drain voltage Vd of the ESD device of FIG. 1 according to embodiments for different gate voltages Vg and an underlap distance X1=0.
Figure 4:
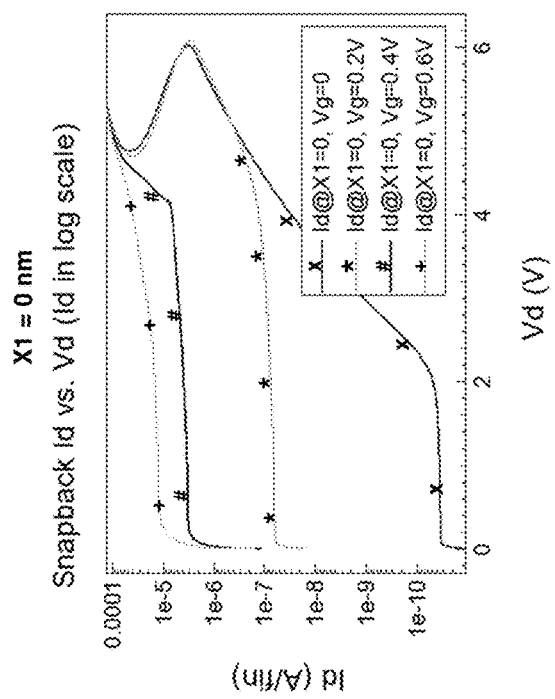
FIG. 4 illustrates the snapback current Id (log scale) versus drain voltage Vd of the ESD device of FIG. 1 according to embodiments for different gate voltages Vg and an underlap distance X1=50 nm.
Figure 5:
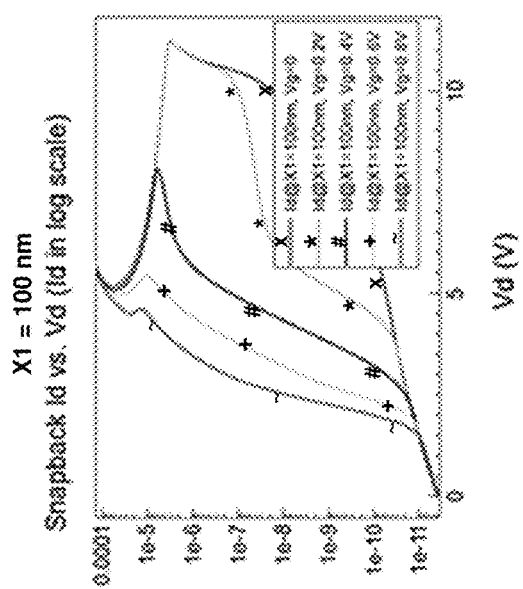
FIG. 5 illustrates the snapback current Id (log scale) versus drain voltage Vd of the ESD device of FIG. 1 according to embodiments for different gate voltages Vg and an underlap distance X1=100 nm.

FIG. 3 illustrates the snapback current Id (log scale) versus drain voltage Vd of the ESD device 100 according to embodiments for different gate voltages Vg and an underlap distance X1=0. FIG. 4 illustrates the snapback current Id (log scale) versus drain voltage Vd of the ESD device 100 according to embodiments for different gate voltages Vg and an underlap distance X1=50 nm. FIG. 5 illustrates the snapback current Id (log scale) versus drain voltage Vd of the ESD device 100 according to embodiments for different gate voltages Vg and an underlap distance X1=100 nm.

In FIGS. 3-5, the snapback current Id for a gate voltage Vg=0V represents the leakage current of the ESD device 100. Comparing FIGS. 3 and 4, for example, it can be seen that the leakage current (i.e., snapback current at Vg=0V) for an overlap distance X1=50 nm (FIG. 4) is substantially smaller than the leakage current for an overlap distance X1=0 (FIG. 3). Indeed, at a drain voltage Vd of 5 V and an underlap distance X1=0 (FIG. 3), the leakage current is approximately 100 nA, while at a drain voltage Vd of 5 V and an underlap distance X1=50 nm (FIG. 4), the leakage current is approximately 0.01 nA. To this extent, the leakage current is reduced by approximately three orders of magnitude (e.g., 1000×) when providing an underlap distance X1=50 nm compared to an underlap distance of X1=0. The use of an underlap distance X1=100 nm affords a similar reduction in leakage current when compared to an underlap distance X1=0. From this and other data presented herein, one can thus extrapolate that the leakage current is reduced for an underlapped distance X1>0.

FIGS. 6-8 depict the same data as that shown in FIGS. 3-5, respectively, but using a different scale (i.e., linear vs. log) for the snapback current Id. In particular, FIG. 6 illustrates the snapback current Id (linear scale) versus drain voltage Vd of the ESD device 100 of FIG. 1 according to embodiments for different gate voltages Vg and an underlap distance X1=0. FIG. 7 illustrates the snapback current Id (linear scale) versus drain voltage Vd of the ESD device 100 of FIG. 1 according to embodiments for different gate voltages Vg and an underlap distance X1=50 nm. FIG. 8 illustrates the snapback current Id (linear scale) versus drain voltage Vd of the ESD device 100 of FIG. 1 according to embodiments for different gate voltages Vg and an underlap distance X1=100 nm.

Comparing FIGS. 6-8, it can be seen that the trigger voltage Vt required for turning on the ESD device 100 may be dynamically controlled in a number of ways. For example, the trigger voltage Vt may be controlled based on the overlap distance X1 of the ESD device 100 and/or the gate voltage Vg applied to the gate structure 114 of the UL-NFET 102 of the ESD device 100. For example, FIG. 9 depicts a table (Table 1) showing the relationship between the trigger voltage Vt, underlap distance X1, and gate voltage Vg of the ESD device 100 of FIG. 1, based on the data provided in FIGS. 6-8.

From Table 1, it can be seen that in the case of no underlap (underlap distance X1=0), a gate voltage Vg of about 0.2 volts results in a trigger voltage Vt of about 6 V, while a gate voltage Vg of about 0.4 volts results in a trigger voltage Vt of about 4.2 V. A greater range of trigger voltages Vt are possible for an underlap distance X1=50 nm. For example, again from Table 1, it can be seen that in the case of an underlap distance X1=50 nm, a gate voltage Vg of about 0.2 volts results in a trigger voltage Vt of about 10.5 V, while a gate voltage Vg of about 0.8 volts results in a trigger voltage Vt of about 3.5 V. The gate voltage Vg, which may be set by the voltage divider formed by the series connection of the capacitor 104 and the intrinsic gate to source capacitance Cgs, can also be tuned by varying the capacitance of the capacitor 104 coupled to the gate structure 114 of the UL-NFET 102. In summary, the trigger voltage Vt can be dynamically tuned over a wide range by varying at least one of:

1) The gate voltage Vg;
2) The capacitance of the capacitor 104; and
3) The underlap distance X1.

The ESD device 100 provides a trigger path (TP) for current in response to an ESD event 130 at the input pad 122. As will be described in detail below with regard to FIGS. 10 and 11, current flowing along the trigger path in response to an ESD event 130 actuates a discharge path (DP) through a discharge path device that safely dissipates the ESD current to ground.

Figure 10:
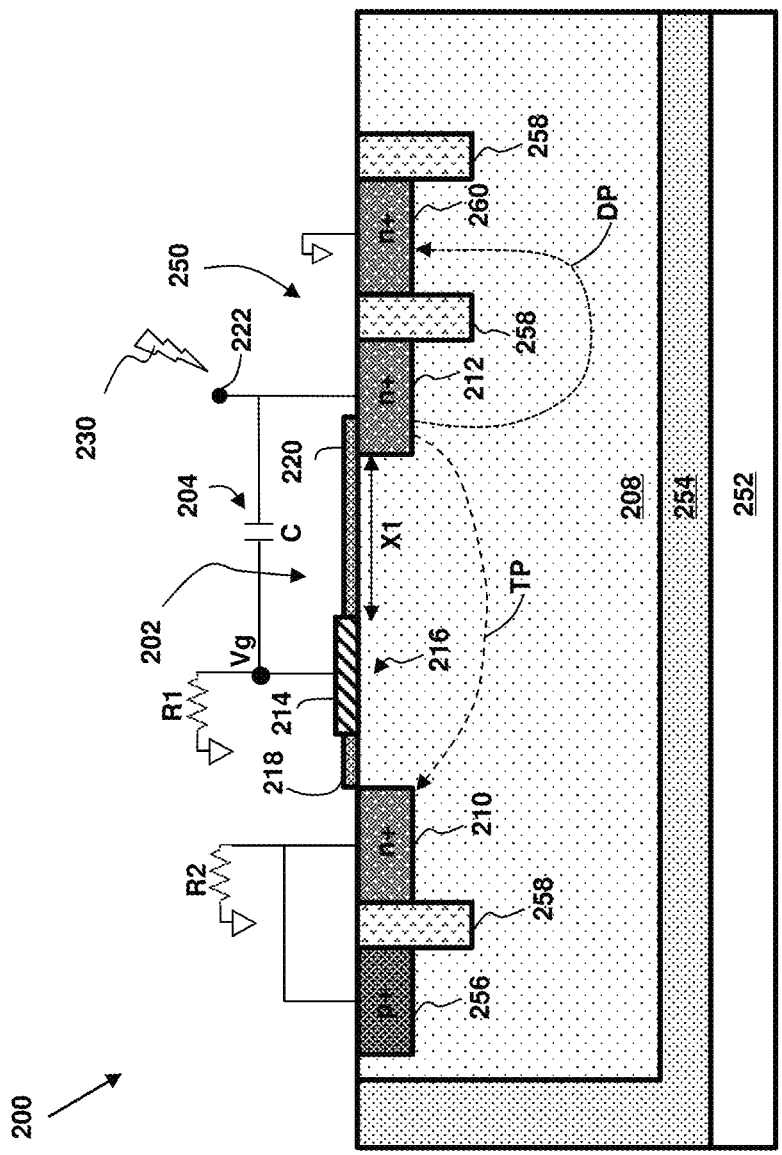
FIG. 10 depicts an ESD device and an npn device for providing a discharge path according to embodiments.

FIG. 10 depicts an ESD device 200 including an underlapped n-type field effect transistor (UL-NFET) 202 and an npn device 250 for providing a discharge path according to embodiments. The UL-NFET 202 may be formed in a p-type doped region 208 (e.g., hereafter p-well 208) and may include an n+-doped source region 210, an underlapped n+-doped drain region 212, and a gate structure 214. The p-well 208 may be separated from a substrate 252 by an n-type doped region 254 (e.g., an n-well). Again, as described above, an 'underlapped region' it is meant a diffusion region in which no part thereof is located directly beneath the gate structure 214. As shown in FIG. 10, for example, the underlapped n+-doped drain region 212 is spaced away from the edge of the gate structure 214 and an underlying gate channel region 216 by an underlap distance X1. The various doped regions described herein may be formed in any known manner (e.g., via ion implantation). The various gate structures described herein may also be formed in any known manner.

A silicide blocking layer, including a source-side silicide blocking (SOP) region 218 and a drain-side silicide blocking (DOP) region 220, may be formed over the p-well 208 and underlapped n+-doped drain region 212. The forming of the silicide blocking layer may include, for example, depositing an insulating layer and selectively etching the insulating layer. The silicide blocking layer may, for example, be formed of silicon oxide or silicon nitride.

According to embodiments, the underlapped n+-doped drain region 212 may be coupled to an input terminal or pad 222 (hereafter input pad 222). The gate structure 214 of the UL-NFET 202 may also be coupled to the input pad 222 through a capacitor 204. The gate structure 214 and the n+-doped source region 210 of the UL-NFET 202 may be coupled to ground through resistors R1 and R2, respectively. The n+-doped source region 210 may also be coupled to a p+-doped region 256 formed in p-well 208, and may be isolated from the n+-doped source region 210 by an isolation region 258, such as a shallow trench isolation region or a silicon blocking region. The isolation region(s) described herein may be formed in any known manner, for example, by etching a pattern of trenches in the p-well 208, depositing one or more dielectric materials (such as silicon dioxide) to fill the trenches, and removing the excess dielectric using a technique such as chemical-mechanical planarization. Similar to the ESD device 100 depicted in FIG. 1, the gate voltage Vg applied to the gate structure 214 of the UL-NFET 202 may be set by a voltage divider formed by the series connection of the capacitor 204 and the intrinsic gate-source capacitance of the UL-NFET 202.

The npn device 250 may be formed by the underlapped n+-doped drain region 212, which is shared by the UL-NFET 202, an n+-doped region 260 formed in the p-well 208, and the p-well 208. As shown in FIG. 10, the underlapped n+-doped drain region 212 is isolated from the n+-doped region 260 by an isolation region 258.

The UL-NFET 202 may be activated in response to an ESD event 230 at the input pad 222. For example, the UL-NFET 202 may be activated when the voltage between the underlapped n+-doped drain region 212 and the n+-doped source region 210 is larger than the trigger voltage Vt of the UL-NFET 202. In such a case, current flows along a trigger path (TP) from the underlapped n+-doped drain region 212 to the n+-doped source region 210 and subsequently to ground through the resistor R2. The raises the bias of the p-well 208 via the p+-doped region 256, activating the npn device 250. When the npn device 250 activated, current flows along a discharge path (DP) from the underlapped n+-doped drain region 212 to ground through the n+-doped region 260.

Figure 11:
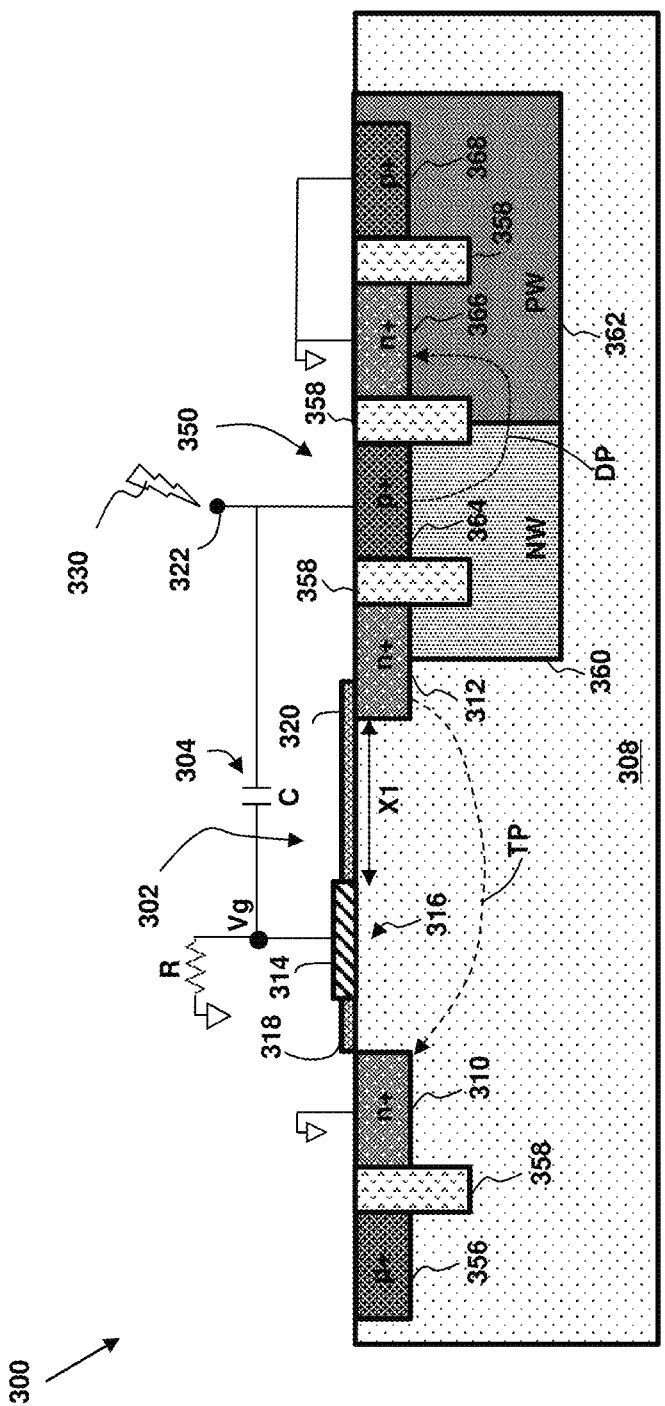
FIG. 11 depicts an ESD device and a silicon-controlled-rectifier (SCR) device for providing a discharge path according to embodiments.

FIG. 11 depicts an ESD device 300 including an n-type field effect transistor (UL-NFET) 302 and a silicon-controlled-rectifier (SCR) device 350 for providing a discharge path according to embodiments. The UL-NFET 302 may be formed in a p-type doped substrate 308 and may include an n+-doped source region 310, an underlapped n+-doped drain region 312, and a gate structure 314. Again, as described above, an 'underlapped region' it is meant a diffusion region in which no part thereof is located directly beneath the gate structure 314. As shown in FIG. 11, for example, the underlapped n+-doped drain region 312 is spaced away from the edge of the gate structure 314 and an underlying gate channel region 316 by an underlap distance X1. The various doped regions described herein may be formed in any known manner (e.g., via ion implantation). The various gate structures described herein may also be formed in any known manner.

A silicide blocking layer, including a source-side silicide blocking (SOP) region 318 and a drain-side silicide blocking (DOP) region 320, may be formed over the p-type doped substrate 308 and underlapped n+-doped drain region 312. The forming of the silicide blocking layer may include, for example, depositing an insulating layer and selectively etching the insulating layer. The silicide blocking layer may, for example, be formed of silicon oxide or silicon nitride.

According to embodiments, the gate structure 314 of the UL-NFET 302 may be coupled to an input terminal or pad 322 (hereafter input pad 322). through a capacitor 304. The gate structure 314 of the UL-NFET 302 may also be coupled to ground through a resistor R. The n+-doped source region 310 of the UL-NFET 302 may also be coupled to ground. A p+-doped substrate contact 356 may be formed in the p-type doped substrate 308 and may be isolated from the n+-doped source region 310 by an isolation region 358, such as a shallow trench isolation region or a silicon blocking region. According to embodiments, the gate voltage Vg applied to the gate structure 314 of the UL-NFET 302 may be set by a voltage divider formed by the series connection of the capacitor 304 and the intrinsic gate-source capacitance Cgs of the UL-NFET 302.

The SCR device 350 according to embodiments may include an n-type doped region (hereafter n-well 360) and a p-type doped region (hereafter p-well 362). Further, the SCR device 350 may include the underlapped n+-doped drain region 312 (which extends partially over the p-type doped substrate 308 and the n-well 360), a p+-type doped region 364 separated from the underlapped n+-doped drain region 312 by an isolation region 358 and coupled to the input pad 322, an n+-type doped region 366 formed in the p-well 362 and coupled to ground, and a p+-type doped region 368 formed in the p-well 362 and coupled to ground. Isolation regions 358 may be formed between the p+-type doped region 364 and the n+-type doped region 366, and between the n+-type doped region 366 and the p+-type doped region 368.

The UL-NFET 302 may be activated in response to an ESD event 330 at the input pad 322. When a positive ESD current is applied on the input pad 322, the diode formed by the p+-type doped region 364 and the n-well 360 is forward biased and current flows into the nwell 360 which is connected to the underlapped n+-doped drain region 312 of the UL-NFET 302. The UL-NFET 302 may then be activated when the voltage between the underlapped n+-doped drain region 312 and the n+-doped source region 310 is larger than the trigger voltage Vt of the UL-NFET 302. In such a case, current flows along a trigger path (TP) from the p+-doped region 364 to the n+-doped source region 310. This current path injects holes into the nwell 360 of the SCR which may trigger the SCR 350 and provide a discharge path to ground.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The invention claimed is:

1. A electrostatic discharge (ESD) device, comprising:
   an input pad;
   an underlapped field effect transistor (UL-FET) with a trigger voltage Vt, including:
     an underlapped drain region coupled to the input pad;
     a source region coupled to ground; and
     a gate structure coupled to a first terminal of a capacitor and a second terminal of the capacitor coupled to the input pad;
   a blocking layer separating the underlapped drain region from the gate structure of the UL-FET by an underlap distance;
   a voltage divider for setting a gate voltage Vg applied to the gate structure of the UL-FET; and
   a silicon-controlled-rectifier (SCR) device laterally adjacent the UL-FET, the SCR device including a P-N-P-N configuration, the P-N-P-N configuration including a first portion coupled to the input pad and a second portion coupled to ground.

2. The ESD device according to claim 1, wherein the voltage divider further comprises the capacitor coupled to the gate structure and the input pad in series with an intrinsic gate-to-source capacitance of the UL-FET.

3. The ESD device according to claim 1, wherein the UL-FET further comprises a trigger path (TP) formed between the underlapped drain region and the source region.

4. The ESD device according to claim 3, further comprising a discharge device coupled to the UL-FET for discharging ESD current along a discharge path (DP) from the input pad to ground in response to an ESD event.

5. The ESD device according to claim 1, wherein the trigger voltage Vt of the UL-FET is controlled by at least one of:
   a gate voltage Vg applied to the gate structure;
   a capacitance of the capacitor coupled to the gate structure and the input pad; and
   the underlap distance between the underlapped drain region and the gate structure.

6. A electrostatic discharge (ESD) device, comprising:
   an input pad;
   an underlapped n-type field effect transistor (UL-NFET) with a trigger voltage Vt, the UL-NFET including:
     an underlapped n+-doped drain region at least partially in a p-type substrate;
     an n+-doped source region in the p-type substrate and coupled to ground; and
     a gate structure coupled to a first terminal of a capacitor and a second terminal of the capacitor coupled to the input pad;
   a silicide blocking layer separating the n+-doped underlapped drain region from the gate structure of the UL-NFET by an underlap distance;
   a voltage divider for setting a gate voltage Vg applied to the gate structure of the UL-NFET; and
   a silicon-controlled-rectifier (SCR) device laterally adjacent the UL-NFET, the SCR device including:
     a p+-doped region coupled to the input pad and over an n-well, the n-well within the p-type substrate,
     an n+-doped region over a p-well, the p-well within the p-type substrate and adjacent the n-well, and
   an isolation region between the p+-doped region and the n+-doped region.

7. The ESD device according to claim 6, wherein the voltage divider further comprises the capacitor coupled to the gate structure and the input pad in series with an intrinsic gate-to-source capacitance of the UL-NFET.

8. The ESD device according to claim 6, wherein the UL-NFET further comprises a trigger path (TP) formed through the p-well between the n+-doped underlapped drain region and the n+-doped source region.

9. The ESD device according to claim 8, further comprising a discharge device coupled to the UL-NFET for discharging ESD current along a discharge path (DP) from the input pad to ground in response to an ESD event.

10. The ESD device according to claim 6, wherein the trigger voltage Vt of the UL-NFET is controlled by at least one of:
    a gate voltage Vg applied to the gate structure;
    a capacitance of the capacitor coupled to the gate structure and the input pad; and
    the underlap distance between the n+-doped underlapped drain region and the gate structure.

11. A electrostatic discharge (ESD) device, comprising:
    An underlapped n-type field effect transistor (UL-NFET) with a trigger voltage Vt, the UL-NFET including:
      an underlapped n+-doped drain region at least partially in a p-type doped substrate;
      an n+-doped source region in the p-type substrate and coupled to ground;
      a p+-doped region over an n-well, the n-well within the p-type substrate and coupled to ground;
      a gate structure coupled to a first terminal of a capacitor and a second terminal of the capacitor coupled to the input pad;
      a first silicide blocking layer separating the n+-doped underlapped drain region from the gate structure of the UL-NFET by an underlap distance; and
    a voltage divider for setting a gate voltage Vg applied to the gate structure of the UL-NFET; and
    a silicon-controlled-rectifier (SCR) device adjacent the UL-NFET, including:
      a first p+-doped region over the n-well and adjacent the underlapped n+-doped drain region,
      an n+-doped region between the first p+-doped region and a second p+-doped region, wherein the n+-doped region and the second p+-doped region are over a p-well,
      a first isolation region between the first p+-doped region and the underlapped n+-doped drain region,
      a second isolation region between the first p+-doped region and the n+-doped region, and a third isolation region between the n+-doped region and the second p+-doped region.

12. The ESD device according to claim 11, wherein the n+-doped region and the second p+-doped region are coupled to ground.

13. The ESD device according to claim 11, further including a second silicide blocking layer separating the gate structure and the n+-doped source region.

14. The ESD device according to claim 11, further including a p+-doped contact in the p-type doped substrate and adjacent the n+-doped source region.

15. The ESD device according to claim 14, further including a fourth isolation region between the p+-doped contact and the n+-doped source region.

16. The ESD device according to claim 6, wherein the n+-doped region is coupled to ground.

\* \* \* \* \*